(12) United States Patent
Liff et al.

(10) Patent No.: US 11,581,238 B2
(45) Date of Patent: *Feb. 14, 2023

(54) HEAT SPREADING LAYER INTEGRATED WITHIN A COMPOSITE IC DIE STRUCTURE AND METHODS OF FORMING THE SAME

(71) Applicant: Intel Corporation, Santa Clara, CA (US)

(72) Inventors: Shawna Liff, Scottsdale, AZ (US); Adel Elsherbini, Tempe, AZ (US); Johanna Swan, Scottsdale, AZ (US); Jimin Yao, Chandler, AZ (US); Veronica Strong, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/318,887

(22) Filed: May 12, 2021

(65) Prior Publication Data

US 2021/0280492 A1    Sep. 9, 2021

Related U.S. Application Data

(63) Continuation of application No. 16/727,703, filed on Dec. 26, 2019, now Pat. No. 11,049,791.

(51) Int. Cl.
*H01L 23/373*     (2006.01)
*H01L 21/768*     (2006.01)
(Continued)

(52) U.S. Cl.
CPC ...... *H01L 23/373* (2013.01); *H01L 21/76801* (2013.01); *H01L 23/481* (2013.01); *H01L 25/0657* (2013.01)

(58) Field of Classification Search
CPC ............... H01L 23/373; H01L 23/481; H01L 21/76801; H01L 25/0657
See application file for complete search history.

(56) References Cited

U.S. PATENT DOCUMENTS 6,472,741 B1 * 10/2002 Chen ................... H01L 23/3128
                                                    257/659
9,070,653 B2 *  6/2015 Stephens ................. H01L 24/92
(Continued)

OTHER PUBLICATIONS

Notice of Allowance for U.S. Appl. No. 16/727,703, dated Feb. 16, 2021.
(Continued)

*Primary Examiner* — Mamadou L Diallo
(74) *Attorney, Agent, or Firm* — Essential Patents Group, LLP.

(57) ABSTRACT

A heat spreading material is integrated into a composite die structure including a first IC die having a first dielectric material and a first electrical interconnect structure, and a second IC die having a second dielectric material and a second electrical interconnect structure. The composite die structure may include a composite electrical interconnect structure comprising the first interconnect structure in direct contact with the second interconnect structure at a bond interface. The heat spreading material may be within at least a portion of a dielectric area through which the bond interface extends. The heat spreading material may be located within one or more dielectric materials surrounding the composite interconnect structure, and direct a flow of heat generated by one or more of the first and second IC dies.

20 Claims, 10 Drawing Sheets

(51) Int. Cl.
H01L 25/065 (2006.01)
H01L 23/48 (2006.01)

(56) References Cited

U.S. PATENT DOCUMENTS

| | | | | |
|---|---|---|---|---|
| 9,425,167 | B2* | 8/2016 | Haba | H01L 24/49 |
| 10,163,744 | B2* | 12/2018 | Kim | H01L 21/561 |
| 2001/0013654 | A1* | 8/2001 | Kalidas | H01L 23/49822 |
| | | | | 257/E23.079 |
| 2006/0060963 | A1* | 3/2006 | Chang | H01L 25/0657 |
| | | | | 257/E25.011 |
| 2010/0193942 | A1* | 8/2010 | Railkar | H01L 24/32 |
| | | | | 257/713 |
| 2012/0092832 | A1* | 4/2012 | Haba | H01L 24/73 |
| | | | | 361/709 |
| 2014/0084444 | A1* | 3/2014 | Lin | H01L 24/83 |
| | | | | 438/122 |
| 2018/0366437 | A1* | 12/2018 | Chen | H01L 23/5389 |
| 2019/0312010 | A1* | 10/2019 | Arvin | H01L 25/065 |
| 2019/0385977 | A1* | 12/2019 | Elsherbini | H01L 24/92 |
| 2020/0273839 | A1* | 8/2020 | Elsherbini | H01L 24/13 |
| 2020/0335479 | A1* | 10/2020 | Li | H01L 21/6836 |
| 2021/0066255 | A1* | 3/2021 | Chen | H01L 21/561 |
| 2021/0193544 | A1* | 6/2021 | Lin | H01L 23/49816 |

OTHER PUBLICATIONS

"Thermal Conductivity", Retrieved online on Dec. 5, 2019 via http://hyperphysics.phy-astr.gsu.edu/hbase/Tables/thrcn.html.
Balandin, A.,"Thermal properties of graphen and nanostructured carbon materials", Nature Materials, vol. 10, Jul. 22, 2011.
Pop, et al., "Thermal properties of graphene: Fundamentals and applications", MRS Bulletin, vol. 37, pp. 1273-1281, Dec. 2012.

* cited by examiner ered by the design rules for the particular metallization layers, and the ability

HEAT SPREADING LAYER INTEGRATED WITHIN A COMPOSITE IC DIE STRUCTURE AND METHODS OF FORMING THE SAME

CLAIM FOR PRIORITY

This application is a continuation of and claims priority to U.S. patent application Ser. No. 16/727,703, filed on Dec. 26, 2019 and titled "HEAT SPREADING LAYER INTEGRATED WITHIN A COMPOSITE IC DIE STRUCTURE AND METHODS OF FORMING THE SAME", which is incorporated by reference in its entirety.

BACKGROUND

The microelectronic industry is continually striving to produce higher computational performance in smaller microelectronic packages for use in various electronic products, such as, computer servers, portable computers, electronic tablets, desktop computers, and mobile communication handsets. High performance computing products often now have multiple integrated circuit chips, or die, packed densely into microelectronic packages with small form factors that can pose many thermal challenges.

Thinning of die can further complicate the ability to spread and dissipate heat within a multi-chip package solution. This is particularly true where vertical (3D) integration is practiced, for example where two or more IC dies are stacked (according to multi-chip packaging, wafer stacking, or die stacking techniques).

One method in 3D stacking is to add microbumps between die or packages to help promote thermal spreading. However, often these microbumps are encapsulated by silica-filled organics having low thermal conductivity. The spreading is also limited to the area of the smallest component, and the minimum assembly pitch available. Consequently, as the die size shrinks and the power density increases, the lateral thermal spreading is limited.

Another approach is to purposefully design back-end of line (BEOL) metal layers of an IC die to improve heat flow from under high power density devices. However, the patterns leveraged to spread the heat are limited by the design rules for the particular metallization layers, and the ability for the active circuitry to accommodate the thermal spreading features.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
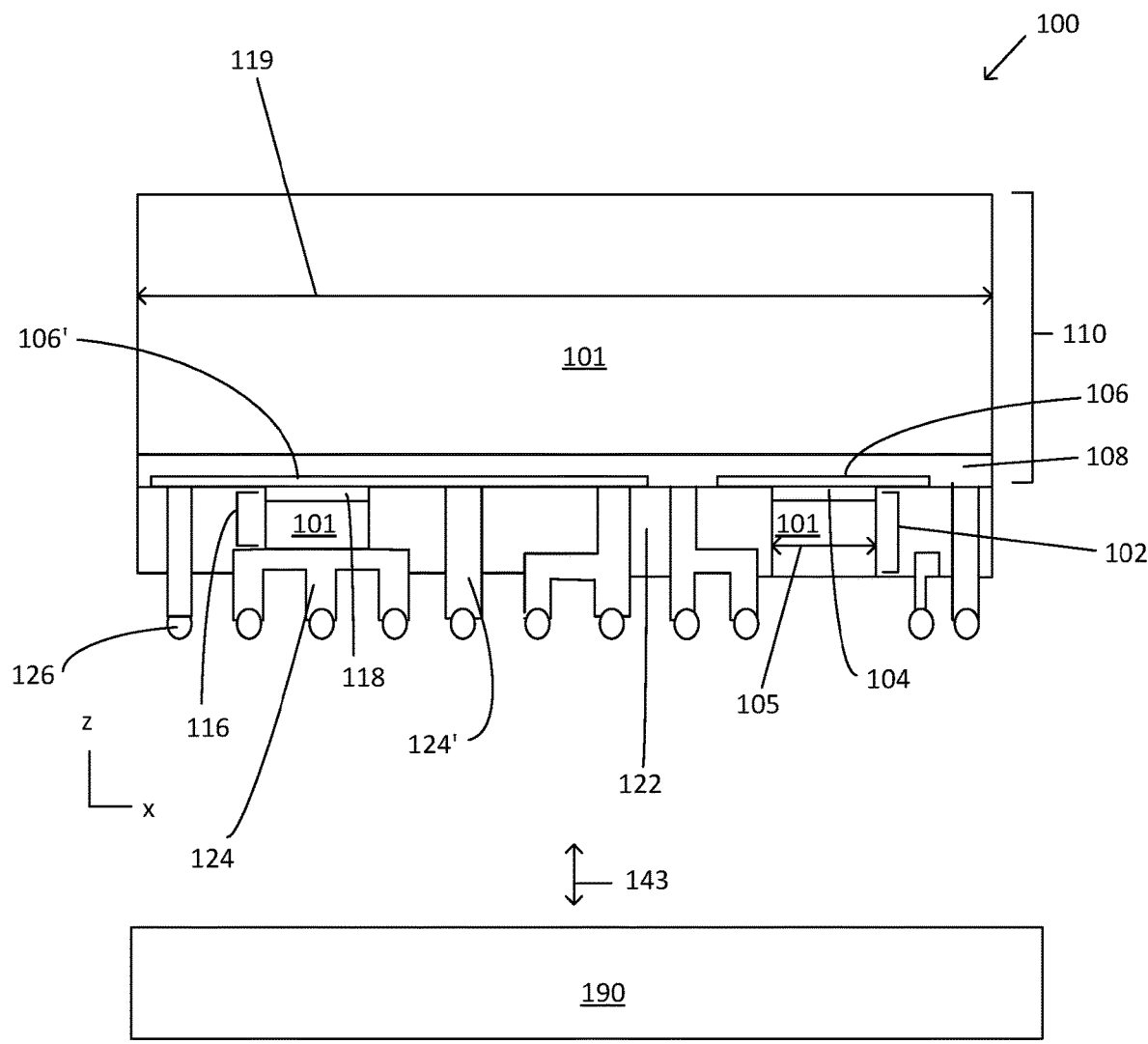
FIG. 1 illustrates a cross-sectional view of a heat spreading material integrated into a composite IC die structure, according to some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized, and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the embodiments herein may be practiced without these specific details. In some instances, well-known methods and devices are shown in block diagram form, rather than in detail, to avoid obscuring the embodiments herein. Reference throughout this specification to "an embodiment" or "one embodiment" or "some embodiments" means that a particular feature, structure, function, or characteristic described in connection with the embodiment is included in at least one embodiment herein. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact with or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "circuit" or "module" may refer to one or more passive and/or active components that are arranged to cooperate with one another to provide a desired function. The term "signal" may refer to at least one current signal, voltage signal, or magnetic signal. The terms "substantially", "close", "approximately", "near", and "about" generally refer to being within +/−10 percent of a target value.

As further described below, in direct hybrid bonding of multiple IC dies, the direct bond can avoid densification limitations of solder assembly as well as eliminate organic interface materials having high thermal resistance. However, thermal conduction within a bonded composite die structure would still be limited by the properties of the materials employed in IC die back-end, (e.g. silicon, silicon dioxide, silicon nitride, and copper). The design rules associated with the various interconnect circuitry levels may also remain a limitation to thermal conduction within a composite die. However, as further described below, direct bonding is leveraged to improve thermal spreading. In accordance with some embodiments, a heat spreading material is introduced at or near the bond interface between two IC die that are directly bonded into a composite IC die structure. Direct bonding to form the composite IC die structure therefore further affords the opportunity to introduce a heat spreading material and/or structure that is specifically designed for directing and/or improving a flow of heat to be generated during the operation of the composite IC die structure.

In accordance with some embodiments, a heat spreading material is located within, and/or near the bonding interface of two IC die. Such a heat spreading material may be selected and/or patterned to specifically promote the lateral thermal spreading of heat, for example, away from small, high thermal density devices that are interconnected through hybrid bonded composite interconnect structures. Such heat may be directed along predetermined dissipation pathways, for example as defined through a selective formation or patterning of the heat spreading material. Some exemplary materials, integration schemes, and structures are described in further detail below.

The stacked die structures described herein may be fabricated by practicing direct bonding techniques. Where a bond interface comprises both metal regions and dielectric regions direct bonding techniques are often referred to as "hybrid" bonding. Whether through thermo-compression, or compression alone, a direct bond interface is distinct from a bond perfected by some intermediate structural material (e.g., a glue layer such as solder). While hybrid bonding can achieve direct bonds between two BEOL IC die levels, in exemplary embodiments herein, a heat spreading material layer is applied to one or both of the BEOL IC die levels that are to be directly bonded. The composition and structural attributes (e.g., thickness and footprint) of the heat spreading material may augment the BEOL IC die levels that are to be bonded. Upon bonding the IC die, a resultant composite IC die structure will include not only a composite electrical interconnect structure where two metal interconnect features of the separate die are bonded together, but will further include a heat spreading material within at least a portion of the dielectric material(s) surrounding the composite electrical interconnect structure.

In some embodiments, a heat spreading material layer is patterned into a heat spreading material structure that is located within and/or on a portion of a dielectric material of an IC die. The heat spreading material or structure may replace a portion of a BEOL dielectric, or otherwise supplement the BEOL dielectric, for example near where power dissipating structures, such as IC power lines or transistors, are most prevalent. The heat spreading material or structure may further extend into regions of a composite IC die where power dissipating structures are less prevalent, for example to laterally spread heat between high and low power dissipating regions of a composite IC die. The heat spreading material may also vertically route heat between multiple bonded IC die and laterally spread heat into regions of a composite IC die that are beyond the confines of one of the IC die. As patterned, this integrated heat spreading material layer or structure may be located at, within, or near a bond interface between the BEOL dielectric material/layers of two hybrid bonded IC die, which are incorporated within a composite die structure. The heat spreading material or structure may therefore improve the vertical and/or lateral thermal spreading of heat within a composite die structure beyond what would otherwise be possible in the absence of the heat spreading material layer or structure.

In some embodiments, a first die within a composite die structure has a first dielectric material and a first (electrically) conductive interconnect structure within a first portion of the first dielectric material. A second die within the composite die structure has a second dielectric material and a second conductive interconnect structure within the second dielectric material. In a composite interconnect structure of the composite die structure, the first interconnect structure is in direct contact with the second interconnect structure at a bond interface between the first and second die. In addition to the first and second dielectric materials, the composite die structure further includes a heat spreading material. The heat spreading material may be at the bond interface. The heat spreading material may have any arbitrary shape (pattern)

and be located near hot spots anywhere within a plane of the composite die structure that is substantially parallel to a plane of the bond interface.

FIG. 1 is a cross-sectional view of a portion of a heat spreading material 106 integrated within a composite IC die structure 100, in accordance with some embodiments of the present disclosure. FIG. 1 illustrates an example where multiple smaller IC die 102, 116 are directly bonded to a larger base IC die 110, with heat spreading material 106, 106' to spread heat over the larger base IC die. However, alternative arrangements are also possible.

Composite IC die structure 100 includes an IC die 102, IC die 110 and IC die 116. IC die 102, IC die 110 and IC die 116 may each be any type of device, and may include any number of circuit elements, such as any type of transistor elements and/or passive elements. IC die 102 and IC die 110 may each include a device layer, that may be, for example, part of a semiconductor material 101. The device layer may further include N-type and/or P-type transistors, for example. The device layer may include one or more device materials such as silicon, germanium, indium, antimonide, lead telluride, indium arsenide, indium phosphide, gallium arsenide, or gallium antimonide, for example. Transistors may be planar transistors and/or nonplanar transistors, such as FinFET transistors, nanowire transistors or nanoribbon transistors. IC die 102, IC die 110, and IC die 116 may include electrically conductive through vias or other interconnect structures (not depicted) that extend through the device layer enabling interconnection on both the top and bottom surfaces of the IC die, or not. In the illustrated embodiment, IC die 110 has a lateral width 119 that is greater than a lateral width 105 of the IC die 102 and IC die 116. In other embodiments, two IC die of a composite die structure may be of substantially the same footprint (lateral width*lateral length).

IC die 102, 110 and 116 may comprise any suitable IC die of any process technology node and having any function. In some embodiments, at least one of IC die 102, 110 and 116 is a microprocessor while another of IC die 102, 110 and 116 is an electronic memory. In some embodiments, one or more of IC die 102, 110, 116 may include a processing system (either single core or multi-core). In some embodiments, one or more of IC die 102, 110, 116 is a microprocessor, a graphics processor, a signal processor, a network processor, a memory device, a voltage regulator, an FPGA, a transceiver or serializer/deserializer, or a passive device. In some embodiments, one or more of IC die 102, 110 and 116 is a system-on-chip (SoC) having multiple functional units (e.g. one or more processing units, and one or more graphics units, and one or more communications units, etc.).

As further illustrated, IC die 102 includes one or more device layers and a back-end of line (BEOL) stack. IC die 110 also includes one or more device layer and another BEOL stack. Within each BEOL stack there is electrical interconnect routing metallization (not depicted), which is embedded within dielectric materials 104 and 108. Dielectric materials 104 and 108 may have the same composition, or may have different compositions. Dielectric materials 104, 108 may each be any dielectric material(s) suitable in the BEOL, such as dielectric materials comprising silicon, and one or more of nitrogen, carbon or oxygen, combinations thereof, etc. Although not illustrated in FIG. 1 for the sake of clarity, any number of interconnect metallization features may be present within dielectric materials 104 and 108. An uppermost surface of dielectric material 104 (and any interconnect metallizaton therein) is in direct contact with an uppermost surface of dielectric material 108 (and any interconnect metallization therein). These surfaces are bonded together, for example through dielectric covalent bonds and metal interdiffusion spanning a bond interface between IC die 102 and IC die 110.

In accordance with some embodiments, heat spreading material 106 is between dielectric material 104 and dielectric material 108. In the illustrated embodiment, heat spreading material 106 is at least partially embedded within dielectric material 108. As such, heat spreading material 106 is between dielectric material 108 and a bond interface between IC die 110 and IC die 102. Alternatively, heat spreading material 106 may be at least partially embedded within dielectric material 104, with heat spreading material 106 then being between dielectric material 104 and the bond interface of composite IC die structure 100. Heat spreading material 106 may also be at least partially embedded within both dielectric materials 104 and 108, with heat spreading material 106 then being on both sides of the bond interface of composite IC die structure 100 (i.e., between each of dielectric materials 104, 108 and the bond interface).

In exemplary embodiments, heat spreading material 106 has a higher thermal conductivity (K) than that of dielectric material 104 and/or dielectric material 108. Heat spreading material 106 may have a thermal conductivity somewhere between that of dielectric materials 104, 108 and that of a composite electrical interconnect that spans the bond of composite IC die structure 100. Heat spreading material 106 may even have a thermal conductivity exceeding that of a composite electrical interconnect that spans the bond of composite IC die structure 100.

In some embodiments, the heat spreading material 106 has structural anisotropy that has an orientation relative to a plane of the bond interface between IC die 102 and IC die 110. Such structurally anisotropic materials may advantageously have a thermal conductivity that is greater in-plane of the bond interface than out-of-plane of the bond interface. In some such embodiments, the structurally anisotropic material is oriented so that heat is more readily spread within a plane parallel to the bond interface of composite IC die structure 100 than within a plane non-parallel (e.g., substantially orthogonal) to the bond interface.

In some embodiments, heat spreading material 106 comprises at least one of graphene, graphene nano-ribbons, graphite, reduced graphite oxide, multi-walled or single-walled carbon nanotubes, hexagonal boron nitride (h-BN), or carbon fibers. The in-plane thermal conductivity of graphite, for example, may be greater than 1000 W/mK, while the out of plane thermal conductivity of graphite may be about 4 W/mK. For nano-tube embodiments, thermal spreading may be greater along the tube as compared with through the tube wall and therefore a length of the tubes may extend in a direction substantially parallel to the bond interface for higher in-plane heat spreading than in an orthogonal direction, out of the plane of the bond interface.

Heat spreading material 106, for example comprising graphene, graphite or carbon nano-tubes, may be selectively surface functionalized by utilizing physical vapor deposition (PVD), chemical vapor deposition (CVD) and/or atomic layer deposition (ALD). Heat spreading material 106, for example comprising carbon allotropes, can be selectively oriented via a predetermined patterned template having appropriate surface functionalization.

In other embodiments, heat spreading material 106 has substantially isotropic thermal conductivity. In some embodiments, heat spreading material 106 comprises a metal, as many metals and metallic compounds display isotropic thermal conductivity. In some such embodiments, the metal composition is different from the interconnect metallization features of IC die 102 and IC die 110. For example, heat spreading material 106 may be other than copper. Heat spreading material 106 may comprise aluminum nitride or tungsten carbide, for example. In other embodiments, heat spreading material 106 is non-metallic. For example, heat spreading material 106 may be a diamond-like material (e.g., diamond-like carbon), silicon carbide, or boron nitride (e.g., when anisotropy is not designed into the material).

As further shown in FIG. 1, heat spreading material 106 has a lateral width that is less than lateral width 119, but is greater than a lateral width 105. Heat spreading material 106 may therefore laterally conduct heat from an area of IC die 102 into some larger area less than that of IC die 110. Heat spreading material 106 may be a distinct material layer in contact with a portion of dielectric material 104 (and/or in contact with a portion of dielectric material 108). Heat spreading material 106 may also be in physical contact with one or more composite electrical interconnect structures that are embedded within dielectric materials 104, 108. Dielectric materials 104, 108 may instead electrically isolate heat spreading material 106 from composite electrical interconnect structures. Where heat spreading material 106 is electrically conductive, an electrically insulating gap (not depicted) may also be between heat spreading material 106 and one or more composite electrical interconnect structures. In still other embodiments, heat spreading material 106 has a sufficiently small thickness (e.g., z-dimension) to have a cross-sectional area that results in an electrical resistance that is sufficiently high for electrical leakage through heat spreading material 106 to be tolerable during operation of composite IC structure 100.

As further illustrated in FIG. 1, IC die 116 includes a dielectric material 118. A heat spreading material 106' is between dielectric material 108 and a bonding interface between IC die 116 and IC die 110. Heat spreading material 106' may have any of the attributes described for heat spreading material 106', and in exemplary embodiments heat spreading material 106' has substantially the same material composition as heat spreading material 106. The bonding interface extends between dielectric material 118 and dielectric material 108. In some embodiments, additional heat spreading material 106' may also be between the dielectric material 118 and the bond interface.

Heat spreading material 106' may direct heat generated from the IC die 116 through a desired heat flow path, such as laterally, within a portion of IC die 110 where heat spreading material 106' extends beyond a sidewall of IC die 116. In the illustrated example, IC die 116 further includes interconnect features 124 in contact with a back side of IC die 116 opposite heat spreading material 106', which is thermally coupled through a front side of IC die 116. Interconnect features 124 may include any first level interconnect (FLI) interface. In one example interconnect features 124 are metal features (e.g., copper) of one or more metallized redistribution layers (RDL) included in composite IC structure 100. Interconnect features 124 are embedded with an RDL dielectric material 122, which may be of any suitable composition (e.g., organic dielectrics like polyimide, etc.). Such an RDL structure may include any number of conductive routing layers, vias and planes with only simplified structures depicted in FIG. 1A. In some embodiments, conductive interconnect structures within RDL routing layers comprise ground planes, power planes, capacitors, inductors, or resistors. The RDL routing layers may route electrical signals between any number of IC die laterally and/or vertically.

In composite IC die structure 100, interconnect features 124 are to couple to a host substrate 190 through FLI bumps 126. for example during an assembly process 143 where composite IC die structure 100 is attached to host substrate 190. Hence, heat spreading material 106 is at a lower level of integration than FLI bumps 126. Host substrate 190 may be a passive interposer, active interposer, package substrate, or PCB, for example. As shown, FLI bumps 126 couple interconnect features 124 to host substrate 190. FLI bumps 126 may be solder, for example. Such interconnection allows heat generated in IC die 116 to be laterally spread through a front side of IC die 116 and into IC die 110, as well as vertically conveyed through FLI bumps 126. Notably, if IC die 116 has electrical interconnects on both the front and backside, for example by way of thru-substrate vias, interconnect features 124 can further function electrically, for example providing a ground path, power rail, or conveying electrical signals.

As further shown in FIG. 1, at least a portion of RDL dielectric material 122 is in direct contact with heat spreading material 106'. Heat spreading material 106' also intersects one or more interconnect features 124,' which, as part of an RDL structure, couple FLI bumps 126 to a portion of IC die 110 not covered by (bonded to) IC die 116. In accordance with some embodiments, interconnect features 124' serve as a heat conduit only, for example conveying heat from heat spreading material 106' to host substrate 190. In accordance with some other embodiments, interconnect features 124' further serve an electrical function of composite IC die structure 100, for example conveying one or more of a ground reference voltage, power rail voltage or electrical I/O to IC die 110. In other embodiments, heat spreading material 106' is physically isolated from interconnect features 124', for example so that heat generated by IC die 102 may be conveyed primarily up through IC die 110, rather than down to host substrate 190. IC die 110 may, in turn, be thermally coupled to any suitable thermal solution, such as a heat sink (not depicted).

Either or both of heat spreading materials 106 and 106' may be continuous sheets, spanning an entire area of at least one of IC die 102 or 116. Alternatively, either or both of heat spreading material 106 and 106' may have a structural pattern providing paths of high thermal conductivity that are smaller than the area of at least one of IC die 102 or 116. In some embodiments, heat spreading material 106' is a continuous sheet while heat spreading material 106 is a discontinuous thermal routing structure. Further integration of low thermal conductivity dielectric material 108 and/or or RDL dielectric 122 around the IC dies 102 and 116 may isolate separate heat paths, for example protecting the IC die 102 from heat generated through operation of IC die 116, or IC die 110. Although not depict, a thermal heat solution, such as a heat sink, may be present on the top side (i.e., back side) of IC die 110.

Figure 2:
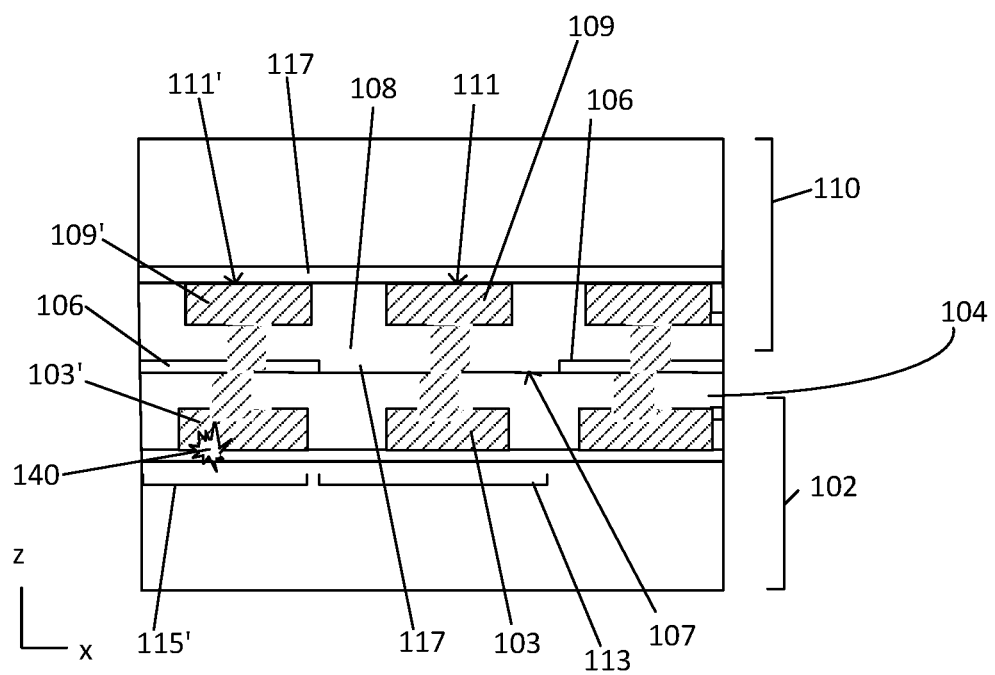
FIG. 2 illustrates a cross-sectional view of a heat spreading material integrated into a composite IC die structure, according to some embodiments.

FIG. 2 depicts an enlarged cross-sectional view of a bond interface 107 between IC die 102 and IC die 110, according to some embodiments. At bond interface 107, dielectric material 104 and dielectric material 108 are in direct contact anywhere heat spreading material 106 is absent. An electrical interconnect structure 103 is within a portion 113 of dielectric material 104. Another electrical interconnect structure 109 is within portion 113 of dielectric material 108. Each of electrical interconnect structures 103, 109 may comprise any conductive material suitable as BEOL IC interconnect metallization, such as copper, ruthenium, titanium, tantalum, tungsten or cobalt, for example, and combinations thereof. Electrical interconnect structures 103 and 109 are in direct contact at bond interface 107, resulting in a composite electrical interconnect structure 111 that interconnects IC die 102 to IC 110. An adjacent electrical interconnect structure 103', and an adjacent electrical interconnect structure 109' may be within a portion 115' of dielectric materials 104, 108, respectively, as portions of another composite electrical interconnect structure 111'. Composite interconnect structure 111' is an example of a thermally coupled composite interconnect structure because it is in contact with heat spreading material 106. Composite interconnect structure 111 is an example of a thermally isolated composite interconnect structure because it is not in contact with heat spreading material 106. Although the interconnect structures illustrated in FIG. 2 show conductive via structures that bond along the bond interface with a line or pad structure coupled to the via structures opposite the bond interface, in other embodiments pad structures may be bonded and via structures coupled to the pads structures opposite the bond interface.

As further shown in FIG. 2, heat spreading material 106 is between dielectric materials 104 and 108 within portion 115, while heat spreading material 106 is absent from portion 113. Therefore, dielectric materials 104 and 108 are in direct contact along only some portion of bond interface 107. The thickness (e.g., z-dimension) of heat spreading material 106 may be between 10 nm to 1000 nm in some embodiments.

Figure 3:
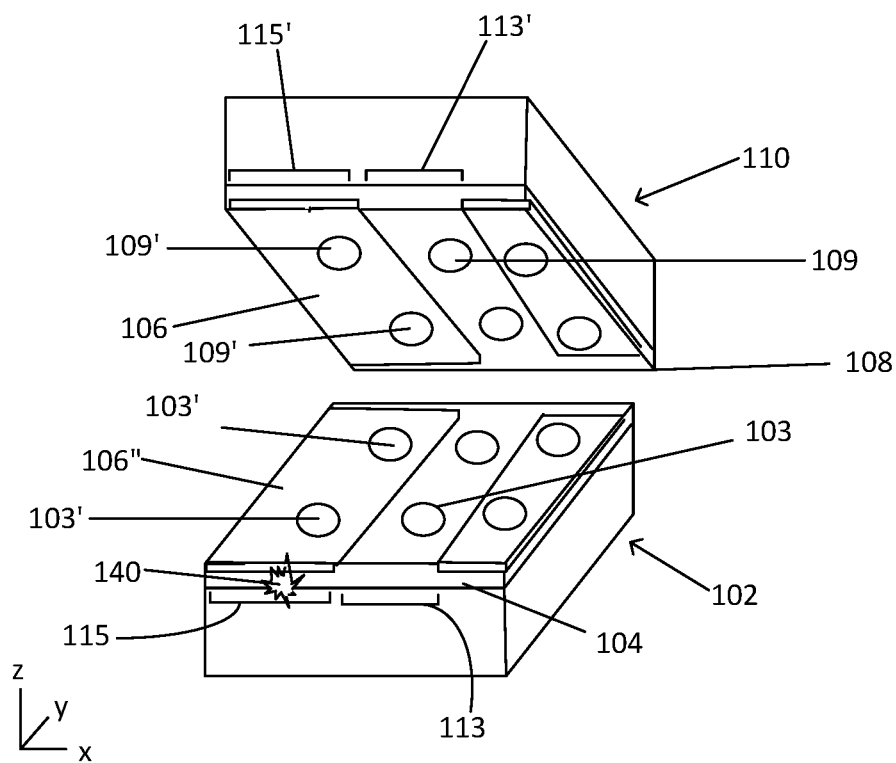
FIG. 3 illustrates an exploded isometric view of a composite IC die structure that includes a heat spreading material, according to some embodiments.

FIG. 3 is an isometric illustration of composite IC structure split along an x-y plane of bond interface 107. As shown, heat spreading material 106 has a routing structure, coupling more than one composite electrical interconnect structure (each comprising a union of interconnect structures 103' and 109'. FIG. 3 also further illustrates an alternative embodiment where there is a heat spreading material (106, 106") within portion 115 of both dielectric materials 104 and 108. For such embodiments, heat spreading material may be present on both sides of bond interface 107. With the illustrated routing structure, heat spreading material 106 (and/or 106") may spread heat from a hot spot 140, laterally in a direction along the heat spreading material 106 length (e.g., along y-axis). Within portion 113, composite interconnect structure 111 is thermally isolated from hot spot 140 since it is not included in the thermal routing path defined by heat spreading material 106 (and/or 106").

As shown in FIG. 2 and FIG. 3, heat spreading material 106 may be laterally separated from an adjacent composite interconnect structure 111 by a portion of dielectric material 104 and/or dielectric material 108. For such embodiments, bond interface 107 comprises both heat spreading material 106 and dielectric materials 104, 108. In the embodiment illustrated in FIG. 2, bond interface 107 is on one side of heat spreading material 106 with the full thickness of the heat spreading material between bond interface 107 and dielectric material 108. In the embodiment illustrated in FIG. 3, bond interface 107 passes through a thickness of heat spreading material with the thickness of heat spreading material 106" between bond interface 107 and dielectric material 108, and the thickness of heat spreading material 106 between bond interface 107 and dielectric material 104.

Figure 4A:
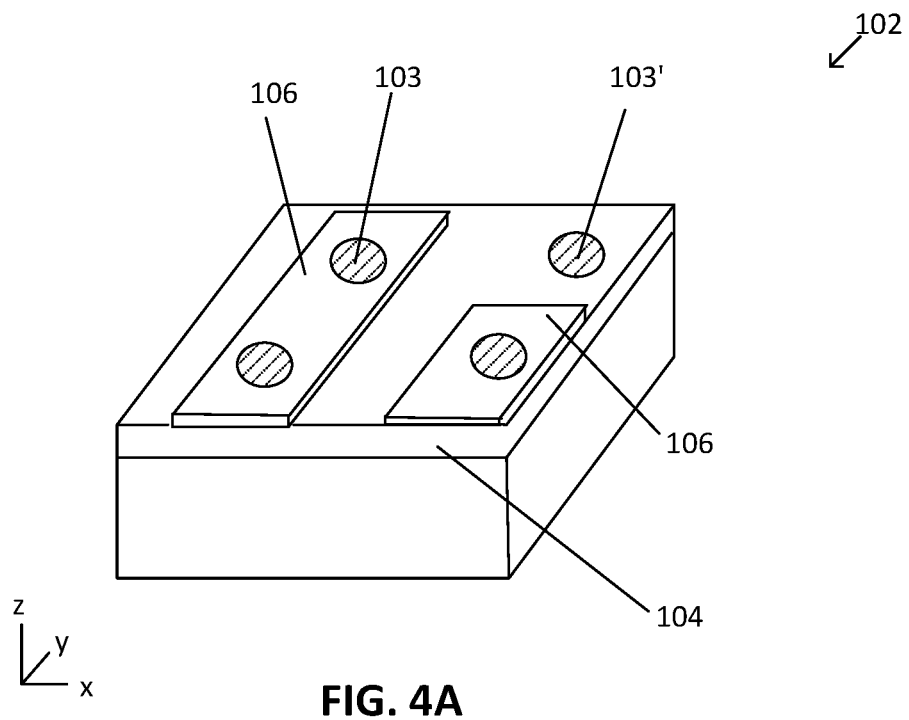
FIGS. 4A and 4B illustrate isometric views of a heat spreading material over an IC die, according to some embodiments

FIG. 4A further depicts heat spreading material 106 over portions of IC die 102. As shown, heat spreading material 106 is substantially planar, and may be localized to thermal spreading regions separated by thermal isolation regions. In some embodiments, a portion of heat spreading material 106 may have a structure that surrounds, and thermally couples, any number of conductive interconnect structures 103. A portion of heat spreading material 106 that contains electrical interconnect structures 103 may, for example, be electrically coupled to common ground. Alternatively, a portion of heat spreading material 106 that contains electrical interconnect structures 103 may be electrically floating. In further embodiments, one or more conductive interconnect structures 103 may be surrounded by dielectric material 104, which may isolate these conductive interconnect structures 103 by providing higher thermal resistance.

Figure 4B:
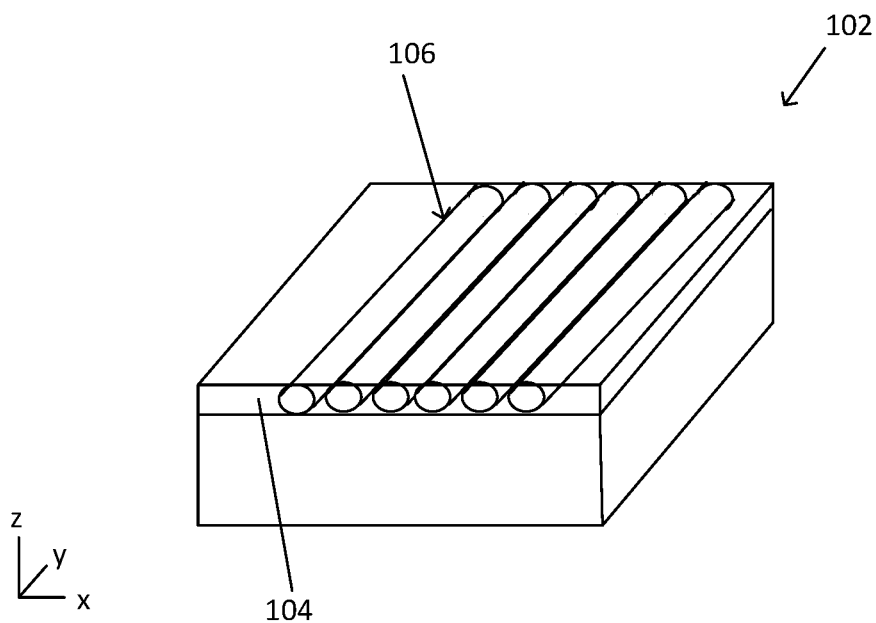

FIG. 4B illustrates an example where heat spreading material 106 comprises a tubular structure, such as a nanotube structure laying in-plane of a bond interface, and having higher thermal conductivity in one direction within the bond interface plane (e.g., along y-axis). In another embodiment, the heat spreading material 106 may comprise an array of tubes. Such tubes may comprise nanotubes, and such tubes may be on and/or at least partially within the dielectric material 104.

Figure 5A:
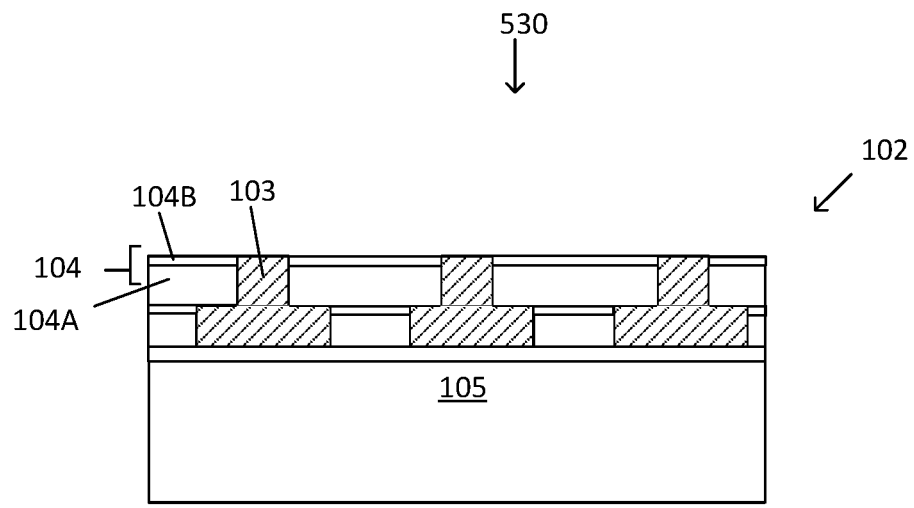
FIGS. 5A, 5B, 5C, 5D and 5E illustrate cross-sectional views of a composite IC die structure evolving to include a heat spreading material structure at a bond interface, according to some embodiments.

FIGS. 5A-5E depict cross-sectional views of a composite die structure evolving to include an integrated heat spreading material structure according to some embodiments. In FIG. 5A, a portion of IC die 102 is shown with one exemplary dielectric material 104 that includes a dielectric material layer 104B over a dielectric material 104A. Dielectric material layer 104B may have a composition distinct from that of material layer 104A. In some examples, dielectric material layer 104B may serve as a damascene etch stop material utilized in the fabrication of electrical interconnect structure 103, and may further facilitate hybrid bonding of IC die 102 to another IC die. Dielectric material layers 104A and 104B may have any compositions described above for dielectric material 104. In some examples, dielectric material layer 104B is a silicon nitride, silicon oxy nitride material, or silicon carbon nitride while dielectric material layer 104A is other than a nitride (e.g., $SiO_x$). Notably, electrical interconnect structure 103 comprises a conductive via over an underlying metal pad but this is merely for sake of illustration, and an interconnect structure could instead be a pad over a conductive via, only a conductive via, or any interconnect structure known to be suitable in semiconductor manufacturing. As noted above, electrical interconnect structure 103 may comprise any suitable conductive material, such as copper, ruthenium, titanium, tantalum, tungsten, aluminum, or cobalt, for example, and combinations thereof. Dielectric material 104 may be over a device layer of IC die 102, which may be part of semiconductor material 101 (e.g., silicon, etc.).

In the illustrated embodiment, a polishing process 530, such as a chemical mechanical polishing (CMP) process, is performed where conductive interconnect structure 103 is planarized with dielectric material layer 104B. Polishing process 530 may end upon exposure of the dielectric material layer 104B and/or upon meeting one or more of roughness, flatness, or dishing requirements associated with hybrid bonding. In an embodiment, dielectric material layer 104B may have a post-polish target thickness suitable as the thickness of a heat spreading material that is to be subsequently formed.

Figure 5B:
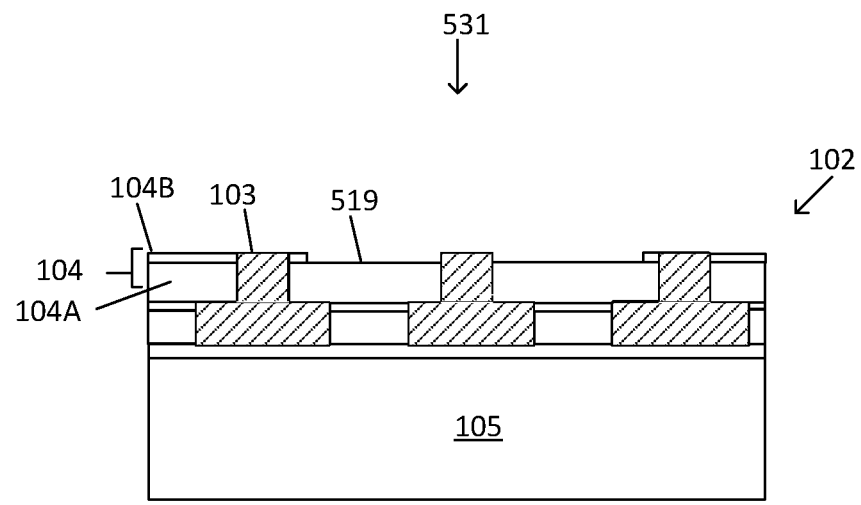

As further shown in FIG. 5B, an etch process 531 may be employed to remove a portion of dielectric material 104. Any masking process may be employed to pattern a desired recess into dielectric material 104. The locations of the recess may define where a heat spreading material is to be located, and may be predetermined based on a desired heat flow path reduces local hot spots within a composite die structure. In the example depicted, the etch process stops on dielectric material layer 104A, exposing a dielectric material surface 519.

Figure 5C:
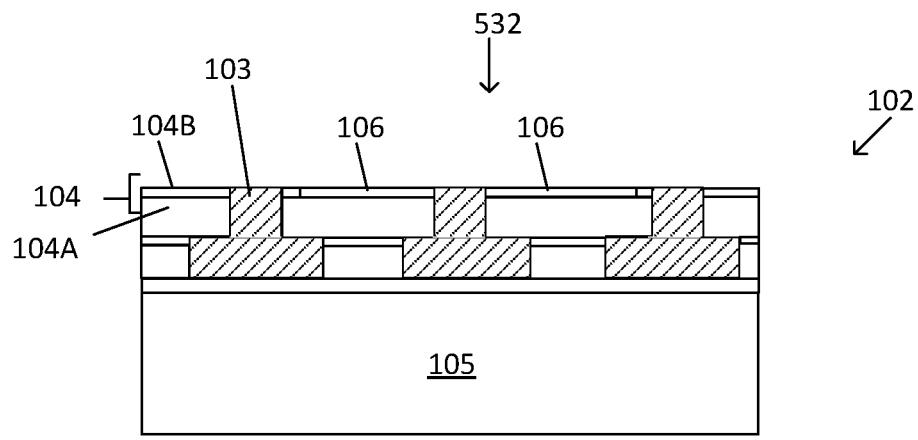

FIG. 5C, illustrates a heat spreading material formation process 532, where heat spreading material 106 is deposited on dielectric material layer 104A, adjacent to sidewalls of dielectric material layer 104B. Heat spreading material 106 may be formed to a thickness dependent upon properties of the material and the number of layers applied. In an embodiment, heat spreading material process 532 may comprise one or more of a chemical vapor deposition (CVD) process, a physical vapor deposition (PVD) process, an atomic layer deposition (ALD) process, an electrophoretic deposition process, or a spin coat and thermal/laser anneal process, for example. Heat spreading material formation process 532 may further include one or more operations that locally pattern a layer of heat spreading material 106 into individual portions or structures. Such patterning operations may include, but are not limited to, mask patterning, deposition and excess material removal (e.g., by etchback or planarization), and mask removal. After formation, heat spreading material 106 may be thermally processed, for example with laser anneal, or with other suitable thermal anneal.

In some specific embodiments where heat spreading material 106 comprises one or more graphene sheets (e.g., having a thickness of less than 10 nm), the graphene may be deposited by a CVD process and/or an electrophoretic deposition process, or formed by a layer transfer process. In another specific embodiment, heat spreading material formation process 532 comprise forming tubes (e.g., carbon nanotubes) on the dielectric material layer 104A, which may be surface functionalized with appropriate chemical treatment (e.g. with silanol or carbonyl or hydroxyl functionalization through patterned self-assembly monolayer integration). Surface functionalization my facilitate bonding and/or orientation of the tubes upon dielectric material layer 104A, to achieve a particular design application.

Figure 5D:
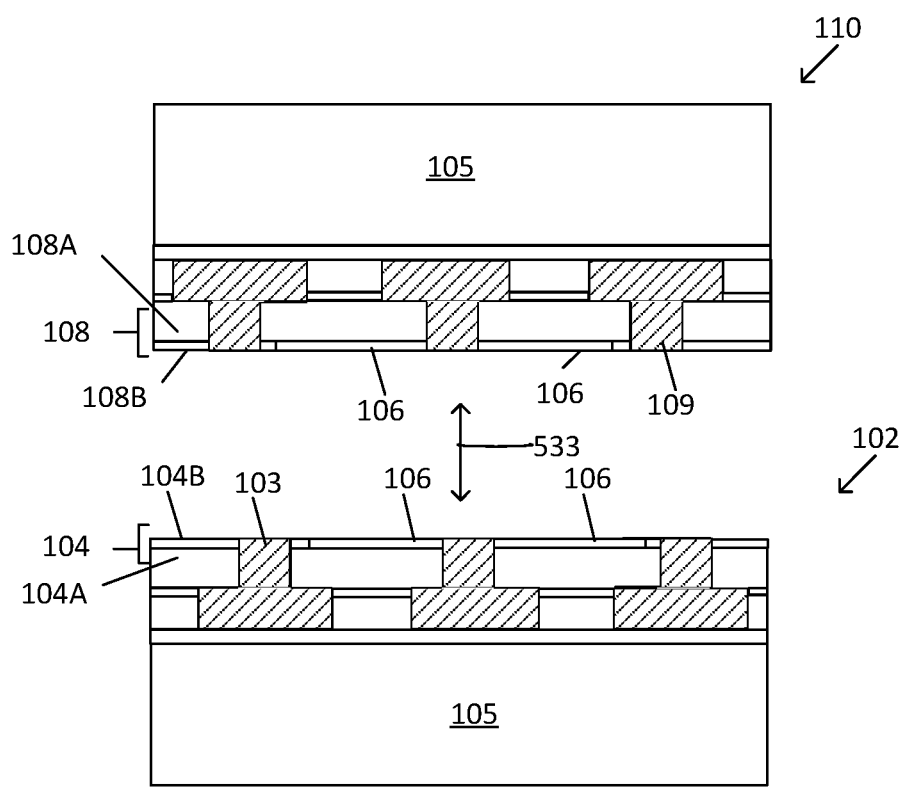
Figure 5E:
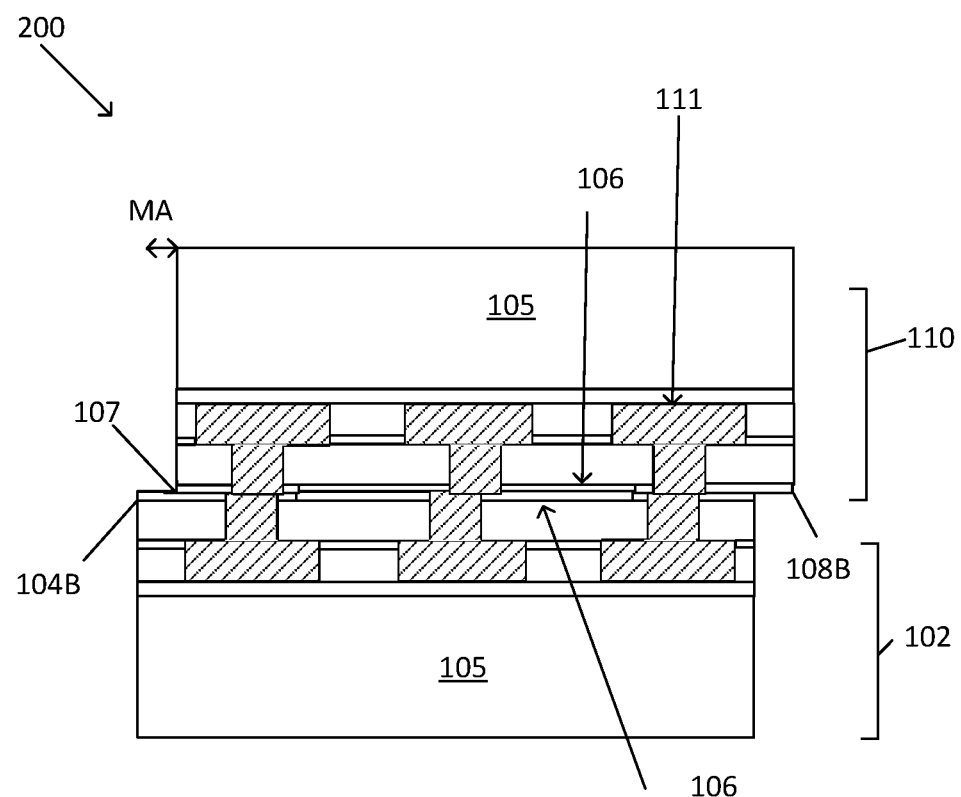

In FIG. 5D, a direct (hybrid) bonding process 533 is practiced to directly bond IC die 102 to IC die 110. During direct bonding process 533, dielectric material 104 (e.g., dielectric material layer 104B) may be directly bonded to dielectric material 108B, resulting in a composite IC die structure 200 as further illustrated in FIG. 5E. Dielectric materials 104 and 108, and more specifically dielectric material layers 104B and 108B, are directly bonded together. Such bonding may initially comprise Vander Walls bonds, and then subsequently by covalent bonds, for example after the package structure 200 undergoes a thermal anneal. Heat spreading material 106 on each of IC die 102 and 110 may also bond together, but it need not for those embodiments where heat spreading material 106 comprises discontinuous structures or portions interspersed over an area of bond interface 107 between IC die 102 and IC die 110. As further illustrated in FIG. 5E, some amount of lateral misalignment MA between IC die 102 and IC die 110 may occur during direct bonding process 533. Although the magnitude of misalignment MA can be expected to decrease over time, it may remain significantly larger than misalignment typically found between two BEOL interconnect features of adjacent metallization levels. As such, composite interconnect structure 111, may display lateral misalignment MA at bond interface 107.

Figure 6A:
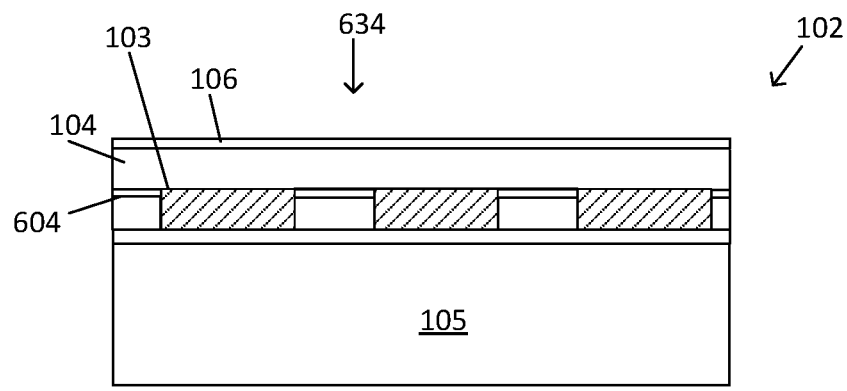
FIGS. 6A, 6B, 6C, 6D, and 6E illustrate cross-sectional views of a composite IC die structure evolving to include a heat spreading material structure at a bond interface, according to some embodiments.

FIG. 6A-6E depict cross-sectional views of an IC die with heat spreading material formed according to an alternate method. A portion of IC die 102 is shown in FIG. 6A. Heat spreading material 106 has been formed over dielectric material 104. One or more conductive interconnect structures 103 are below dielectric material 104 (i.e., at a lower layer). In this example, there is an etch stop material 604 below dielectric material 104, and may be adjacent conductive interconnect structures 103.

Figure 6B:
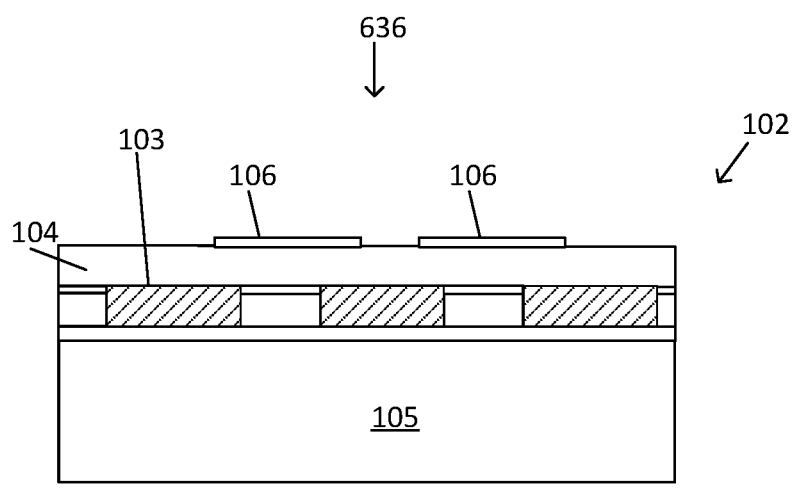
Figure 6C:
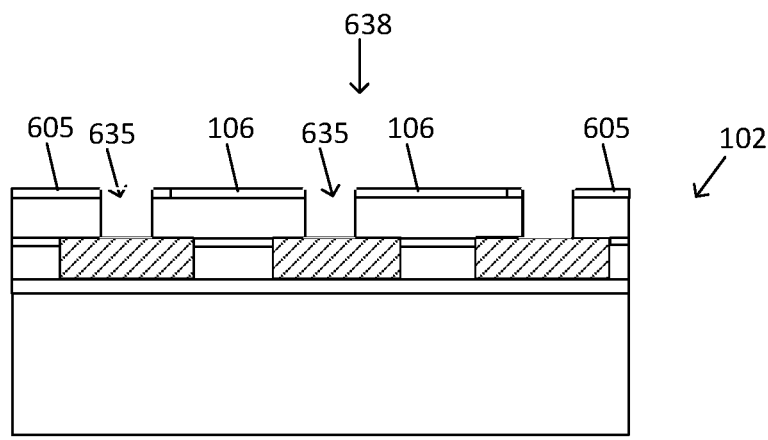
Figure 6D:
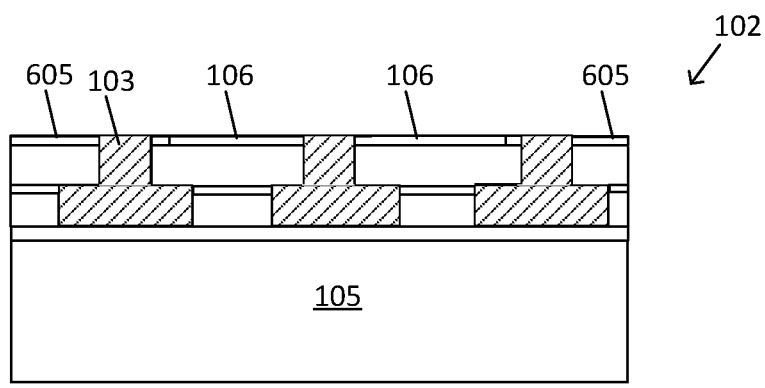

As further shown in FIG. 6B, an etch process 636 may be employed to pattern the heat spreading material 106 over desired locations on dielectric material 104. As shown in FIG. 6C, a mask 605 is formed adjacent to the patterned portions of heat spreading material 106 and an etch process 638 is performed to form openings 635 through dielectric material 104. Subsequently, openings 635 are filled with (electrically) conductive interconnect material 103, for example using barrier/seed deposition and/or fill metal plating processes 540. Metal deposition is followed by CMP, which reveals the hybrid surface shown in FIG. 6D. Notably, although electrical interconnect material 103 is illustrated as being ideally planar, more or less dishing may result from the CMP process. Such dishing may be controlled to perfect a hybrid surface suitable for subsequent bonding.

Figure 6E:
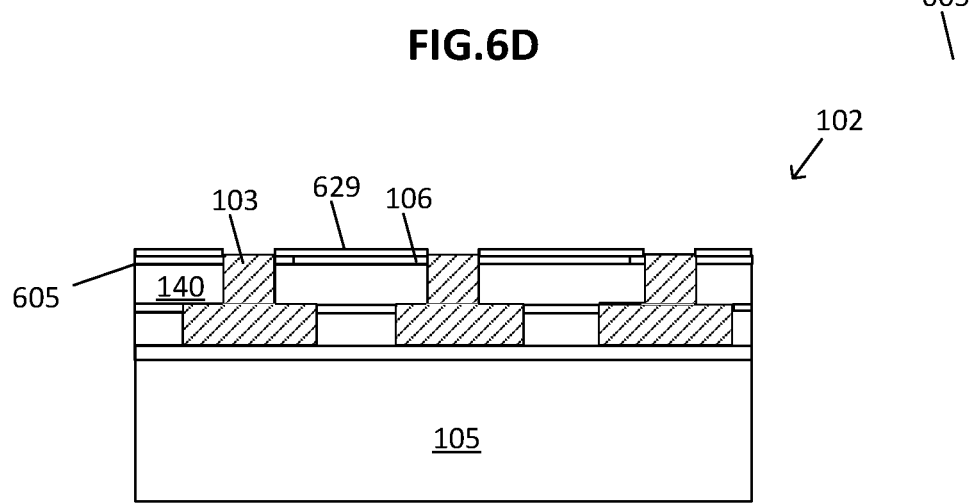

In some embodiments, as further illustrated in FIG. 6E, a passivation material 629 may be formed over heat spreading material 106. Passivation material 629 may enhance dielectric bonding to a second IC die. Passivation material 629 may be formed over the entire surface of the dielectric material 104, and then subsequently patterned and/or planarized as needed. Passivation material 629 may comprise an inorganic material, such as an inorganic dielectric material, for example. Passivation material 629 may be formed by one or more of a PVD, ALD, CVD, or a spin on process, for example. A thermal/pulsed laser anneal may also be performed following film deposition. Passivation material 629 may have a thickness that varies, with some examples ranging between about 10 nm and about 30 nm. With the addition of passivation material 629, IC die 102 is substantially ready for direct bonding, for example with another IC die, to form a composite IC die structure.

Figure 7:
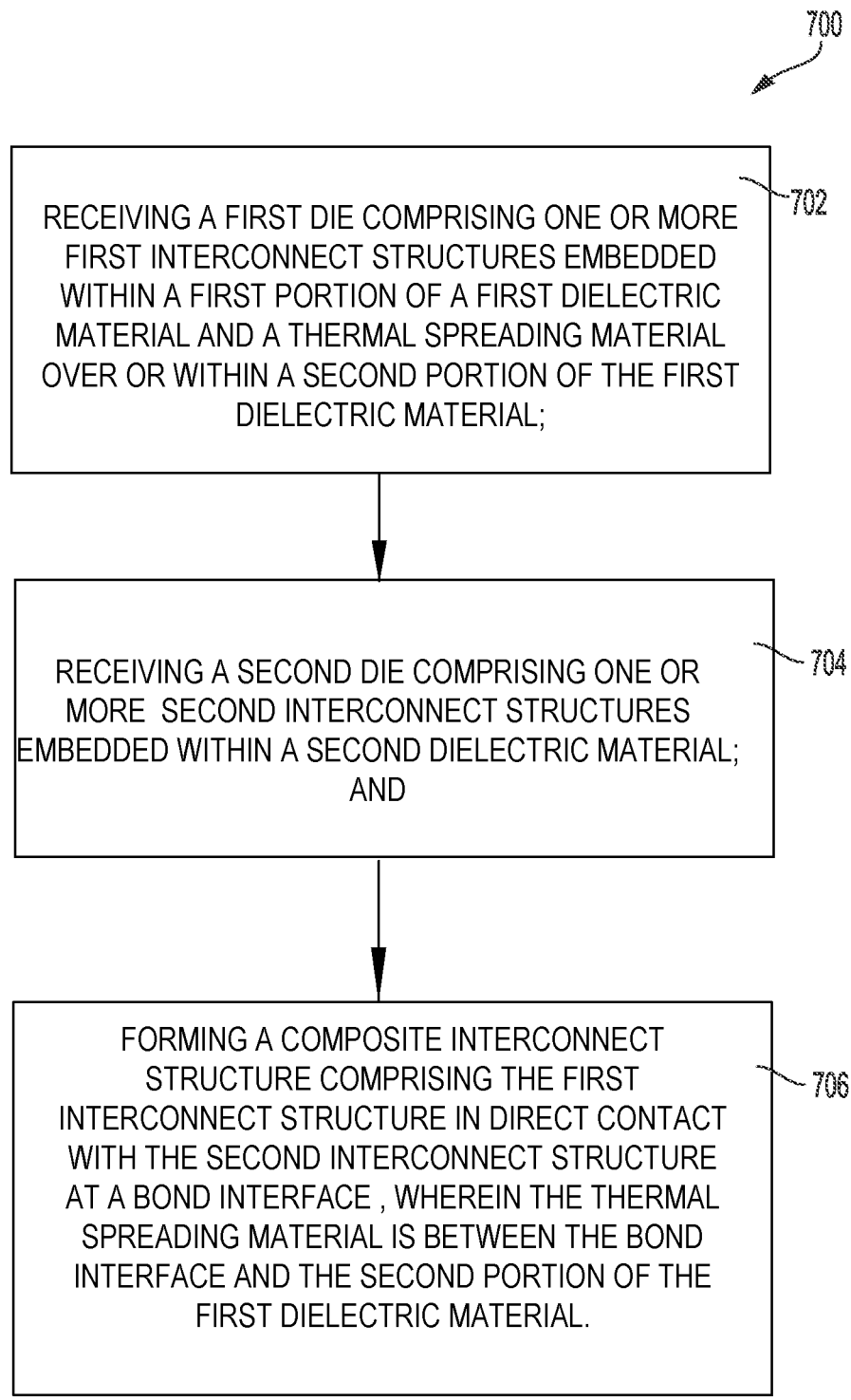
FIG. 7 illustrates a flow chart of methods for fabricating composite IC die structures to include an integrated heat spreading material, according to some embodiments.

FIG. 7 depicts a flow chart of a method 400 for forming integrated heat spreading material structures in composite die systems, in accordance with some embodiments. Method 700 may be practice to form any of the structures disclosed elsewhere herein, for example. Methods 700 may be practiced, for example, to promote and direct lateral thermal spreading, while maintaining hybrid bonding interconnection between IC die, without adding significantly to fabrication process steps. The performance of a composite IC die structure incorporating heat spreading material structures may exhibit improved noise reduction within circuits and improved speed and reliability. Device junction temperatures may be reduced, thus increasing device performance and usability. Handheld or portable device temperature may be reduced, thus increasing user interface capability and battery life. The embodiments disclosed herein may mitigate thermal performance issues by providing integrated heat spreader structures to spread and/or direct the path of thermal dissipation laterally to larger areas that can be in contact with any heat sink solutions known to those in the industry. Method 700 may be especially helpful for IC dies small in area, but high in heat flux (or thermal density) that are integrated within composite die. Some examples include memory or logic circuits that may have exhibit temperature sensitive performance. Method 700 may share any or all characteristics with any other methods discussed herein. Notably, the order of the operations of method 700 may be varied, according to a particular application.

At operation 702, a first IC die is received, wherein the first IC die comprises one or more electrical interconnect structures that are embedded within a first portion of a first dielectric material. A heat spreading material is over and/or within a second portion of the first dielectric material. An electrical interconnect structure is adjacent to the heat spreading material. The first IC die may comprise any suitable IC die, such as a memory die, for example. The electrical interconnect structure may comprise a metal material, and the heat spreading material may comprise a nonmetal material, for example.

At operation 704, a second die comprising one or more electrical interconnect structures embedded within a second dielectric material is received. The second die may have a greater lateral width than a lateral width of the first die, for example.

At operation 706, a composite electrical interconnect structure is formed by placing the first electrical interconnect structure, the first dielectric material, and the thermal spreading layer in direct contact with the second electrical interconnect structure, and the second dielectric material along a bond interface. The first die may be adhered to the second die by hybrid bonding. Hybrid bonding, may initially entail Van der Wall bonding that is subsequently converted during thermal processing to covalent bonding that fuses the dielectric structures, while metal expansion with creep and diffusion may join the electrical interconnect structures of each IC die into a composite interconnect structure.

Figure 8:
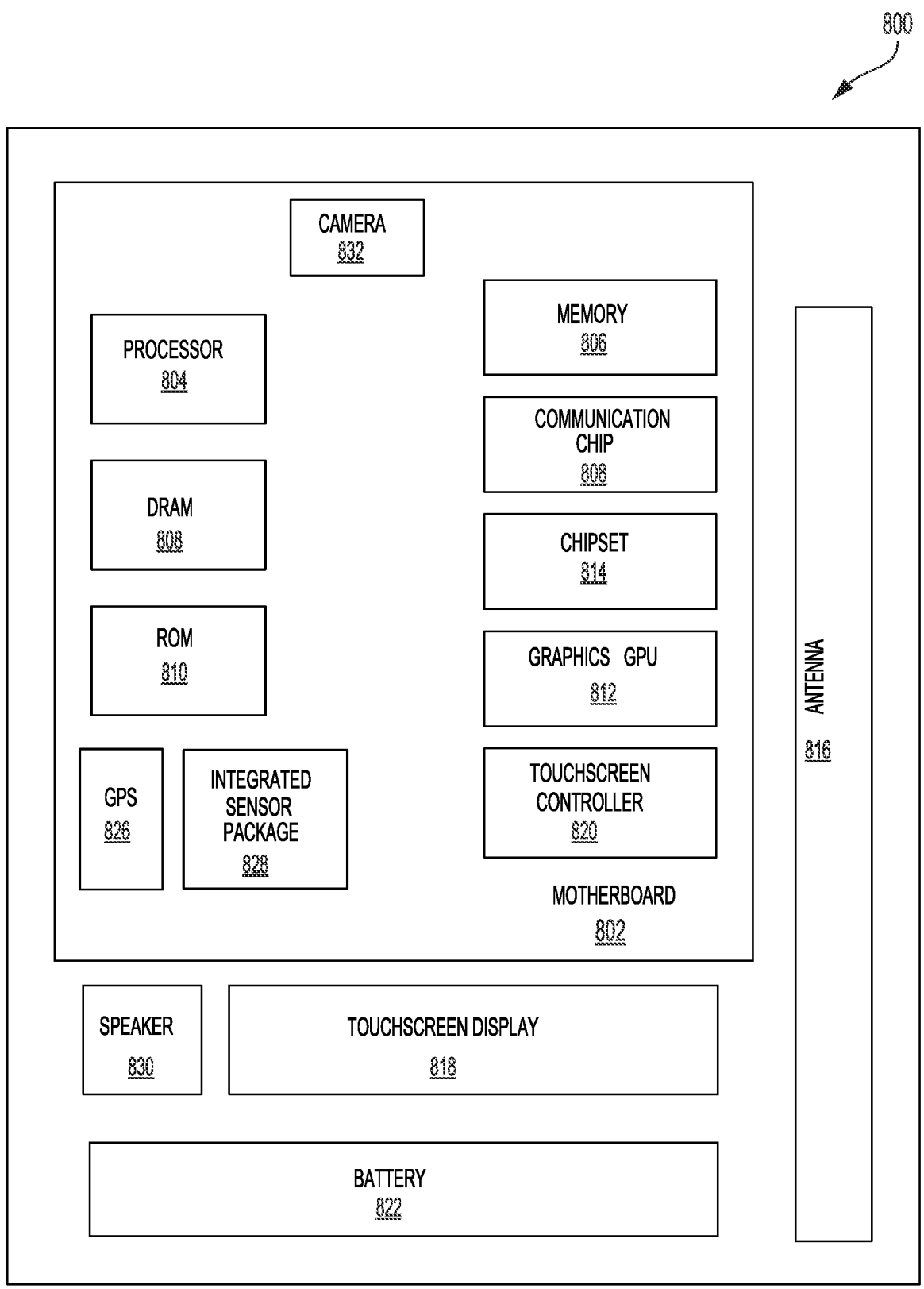
FIG. 8 is a functional block diagram of a computing device including a composite IC die structure with integrated heat spreading material, according to some embodiments.

FIG. 8 is a schematic of a computing device 800 incorporating the composite die structures described in any of the embodiments herein. The integrated heat spreading structures of the composite die structures herein provide a smaller pitch and absence of solder and underfill materials, narrowing the bond interface and supporting better thermal conduction. By integrating a heat spreading layer, such as that depicted in FIG. 1, for example, it is possible to laterally spread heat across the composite die structure in a prescribed direction and with better performance than without the heat spreading layer.

In an embodiment, the computing device 800 houses a board 802, such as a motherboard 802 for example. The board 802 may include a number of components, including but not limited to a processor 804, an on-die memory 806, and at least one communication chip 808. The processor 804 may be physically and electrically coupled to the board 802. In some implementations the at least one communication chip 808 may be physically and electrically coupled to the board 802. In further implementations, the communication chip 808 is part of the processor 804.

Depending on its applications, computing device 800 may include other components that may or may not be physically and electrically coupled to the board 802, and may or may not be communicatively coupled to each other. These other components include, but are not limited to, volatile memory (e.g., DRAM) 809, non-volatile memory (e.g., ROM) 810, flash memory (not shown), a graphics processor unit (GPU) 812, a chipset 814, an antenna 816, a display 818 such as a touchscreen display, a touchscreen controller 820, a battery 822, an audio codec (not shown), a video codec (not shown), a global positioning system (GPS) device 826, an integrated sensor 828, a speaker 830, a camera 832, an amplifier (not shown), compact disk (CD) (not shown), digital versatile disk (DVD) (not shown), and so forth). These components may be connected to the system board 802, mounted to the system board, or combined with any of the other components.

The communication chip 808 enables wireless and/or wired communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 800 may include a plurality of communication chips 808. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 800 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the device structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the present disclosure is not limited to the embodiments so described, but can be practiced with modification and alteration without departing from the scope of the appended claims. For example, the above embodiments may include specific combinations of features as further provided below.

In first examples, a microelectronic structure comprises a first integrated circuit (IC) die comprising a first dielectric material and a first electrical interconnect structure within a first portion of the first dielectric material. The microelectronic structure comprises a second IC die comprising a second dielectric material and a second electrical interconnect structure within the second dielectric material, wherein the first electrical interconnect structure is in direct contact with the second electrical interconnect structure at a bond interface between the first and second IC die. The microelectronic structure comprises a heat spreading material between the bond interface and at least a second portion of the first dielectric material.

In second examples, for any of the first examples, the heat spreading material has a composition different than that of the first and second electrical interconnect structures, and different than that of the first and second dielectric materials.

In third examples, for any of the first through second examples, a thickness of the heat spreading material is between 10 nm to 1000 nm.

In fourth examples, for any of the first through third examples, the heat spreading material is laterally separated from the first electrical interconnect structure by at least the first dielectric material.

In fifth examples, for any of the first examples, the first electrical interconnect structure is separated from the first dielectric material by at least the heat spreading material.

In sixth examples, for any of the first examples the bond interface is between the heat spreading material and the second dielectric material.

In seventh examples, for any of the first examples the bond interface extends through the heat spreading material with a thickness of the heat spreading material between the bond interface and each of the first and second dielectric materials.

In eighth examples, for any of the first through seventh examples, a lateral width of the second IC die is greater than a lateral width of the first IC die, and wherein a conductive via is on a side of the first IC die, opposite the first dielectric material, the conductive via extending approximately perpendicularly to the bond interface.

In ninth examples, for any of the first through eighth examples a third dielectric material is on a first side of a third IC die, wherein the third dielectric material in contact with the second dielectric material of the second IC die.

In tenth examples, for any of the ninth examples, a redistribution layer is in direct contact with the heat spreading material, is adjacent to an edge of at least one of the second IC die and the third IC die.

In eleventh examples, for any of the first through tenth examples, the heat spreading material is a discontinuous layer across a surface of the second dielectric layer.

In twelfth examples, for any of the first through eleventh examples the heat spreading material comprises one or more of silicon carbide, graphene, graphite, graphene nanoribbon, graphite oxide, carbon nanotube, carbon fiber, a diamond-like carbon, aluminum nitride, (hexagonal) boron nitride, or tungsten carbide.

In thirteenth examples, for any of the first through twelfth examples, a passivation layer is between the bond interface and the heat spreading material.

In fourteenth examples, a microelectronic system comprises a package substrate, a first integrated circuit (IC) die having a first side and a second side, the second side of the first IC die is on the package substrate. The system comprises a first dielectric material on the first side of the first IC die, and a first electrical interconnect structure is within a first portion of the first dielectric material. The system includes a second dielectric material on a first side of a second IC die, opposite a second side, and a second electrical interconnect structure is within the second dielectric material. The first electrical interconnect structure is in direct contact with the second electrical interconnect structure at a bond interface between the first IC die and the second IC die. The system comprises a heat spreading material between the bond interface and at least a second portion of the first dielectric material.

In fifteenth examples, for any of the fourteenth examples, the heat spreading material has isotropic thermal conductivity, spreading heat in both x and y directions within a plane substantially parallel to a plane of the bond interface.

In sixteenth examples, for any of the fourteenth through fifteenth examples, the heat spreading material comprises an array of nanotubes with an orientation relative to a plane of the bond interface, the heat spreading material having anisotropic thermal conductivity that varies between x and y direction within the plane.

In seventeenth examples, for any of the fourteenth through sixteenth examples, a third dielectric material is on a first side of a third IC die. The third dielectric material is in contact with the second dielectric material of the second IC die. The heat spreading material is on a second portion of the first dielectric material that is over the third IC die. The heat spreading material is absent a first portion of the first dielectric material that is adjacent to the third IC die.

In eighteenth examples, for any of the seventeenth examples, a first conductive via is on a second side of the third IC die. A second conductive via is in direct contact with the heat spreading material. The second conductive via is adjacent to the first conductive via, and the first conductive via and the second conductive via are thermally coupled to the heat spreading material.

In nineteenth examples, for any of the fourteenth through eighteenth examples the system further comprises a power supply coupled to power at least the first IC die.

In twentieth examples, a method of forming a microelectronic structure comprises receiving a first integrated circuit (IC) die comprising one or more first electrical interconnect structures embedded within a first portion of a first dielectric material, and a heat spreading material over or within a second portion of the first dielectric material. The method comprises receiving a second IC die comprising one or more second electrical interconnect structures embedded within a second dielectric material. The method comprises forming a composite interconnect structure comprising the first interconnect structure in direct contact with the second interconnect structure by directly bonding the first die to the second die along a bond interface, the heat spreading material being between the bond interface and the second portion of the first dielectric material.

In twenty-first examples, for any of the twentieth examples the method comprises depositing the heat spreading material on the first dielectric layer to a thickness of 10 nm to 1000 nm with one or more of physical vapor deposition (PVD), atomic layer deposition (ALD), or chemical vapor deposition (CVD).

In twenty-second examples, for any of the twentieth through twenty-first examples the method comprises defining a heat flow path by patterning a layer of the heat spreading material.

In twenty-third examples, for any of the twentieth through twenty-first examples the method comprises forming the heat spreading material comprises forming one or more of silicon carbide, graphene, graphite, graphite oxide, carbon nanotubes, carbon fibers, diamond-like carbon, aluminum nitride, boron nitride, or tungsten carbide.

In twenty-fourth examples, for any of the twentieth through twenty-third examples, the method further comprises bonding a third dielectric material of a third IC die to the second dielectric material of the second IC die, wherein the heat spreading material is on a first portion of the third dielectric material, and is absent from a second portion of the third dielectric material that is bonded between the third IC die and the second IC die.

However, the above embodiments are not limited in these regards and, in various implementations, the above embodiments may include the undertaking only a subset of such features, undertaking a different order of such features, undertaking a different combination of such features, and/or undertaking additional features than those features explicitly listed. The scope of the embodiments herein should therefore be determined with reference to the appended claims, along with the full scope of equivalents to which such claims are entitled.

What is claimed is:

1. A microelectronic device structure, comprising:
a first integrated circuit (IC) die, wherein a front side of the first IC die comprises first metallization features and a first dielectric material; and
a second IC die, wherein a front side of the second IC die comprises second metallization features and a second dielectric material, and wherein at least one of the first metallization features is in direct contact with at least one of the second metallization features; and
a heat spreading material between the first and second dielectric materials and adjacent to at least one of the first of second metallization features.

2. The microelectronic device structure of claim 1, wherein the heat spreading material has a higher thermal conductivity than that of the first and second dielectric materials.

3. The microelectronic device structure of claim 1, wherein the heat spreading material comprises one or more of silicon carbide, graphene, graphite, graphene nanoribbon, graphite oxide, carbon nanotube, carbon fiber, a diamond-like carbon, aluminum nitride, (hexagonal) boron nitride, or tungsten carbide.

4. The microelectronic device structure of claim 1, wherein a thickness of the heat spreading material is between 10 nm to 1000 nm.

5. The microelectronic device structure of claim 1, further comprising a metallized redistribution structure over the front side of the first IC die and adjacent to an edge of the second IC die, wherein the metallized redistribution structure comprises a first conductive routing feature coupled to at least one of the first metallization features.

6. The microelectronic device structure of claim 5, wherein the metallized redistribution structure comprises a conductive routing feature in direct contact with the heat spreading material.

7. The microelectronic device structure of claim 5, wherein the second IC die is between the first IC die and a conductive routing feature of the metallized redistribution structure that extends over a back side of the second IC die.

8. The microelectronic device structure of claim 1, wherein the first IC die is adhered to the second IC die by a hybrid bond further comprising a portion of the first dielectric in direct contact with a portion of the second dielectric.

9. The microelectronic device structure of claim 8, wherein an interface of the bond extends through the heat spreading material, or between the heat spreading material and at least one of the first or second dielectric materials.

10. The microelectronic device structure of claim 9, wherein a thickness of the heat spreading material is between the bond interface and each of the first and second dielectric materials.

11. The microelectronic device structure of claim 5, further comprising a third IC die, wherein:
a third dielectric material is on a first side of the third IC die;
the third dielectric material is in direct contact with a region of the first dielectric material; and
the conductive routing feature of the metallized redistribution structure is between the second IC die and the third IC die.

12. The microelectronic device structure of claim 1, further comprising a passivation layer between the heat spreading material and at least one of the first dielectric material or the second dielectric material, wherein the passivation layer further comprises a third dielectric material.

13. A microelectronic system, comprising:
a host substrate;
a first integrated circuit (IC) die, wherein a first region of a front side of the first IC die is interconnected to the host substrate through a metallized redistribution structure; and
a second IC die adjacent to the metallized redistribution structure, wherein a front side of the second IC die is in direct contact with a second region of the front side of the first IC die; and
a heat spreading material at a bond interface between the first IC die and the second IC die.

14. The microelectronic system of claim 13, wherein the heat spreading material has isotropic thermal conductivity, spreading heat in both x and y directions within a plane substantially parallel to a plane of the bond interface.

15. The microelectronic system of claim 14, further comprising a power supply coupled to power at least the first IC die.

16. The microelectronic system of claim 14, wherein the host substrate is a passive interposer, an active interposer, a package substrate, or a printed circuit board.

17. A composite integrated circuit (IC) structure, comprising:
a plurality of bonded IC dies, wherein a front side of each of the IC dies comprises metallization features within a dielectric material;
a heat spreading material at a bond interface between the IC dies, the heat spreading material adjacent to a composite interconnect structure comprising one of the metallization features of a first of the IC dies and one of the metallization features of a second of the IC dies.

18. The composite IC structure of claim 17, wherein the heat spreading material has a higher thermal conductivity than that of the first and second dielectric material.

19. The composite IC structure of claim 18, wherein an interface of the bond extends through the heat spreading material, or between the heat spreading material and the dielectric material.

20. The composite IC structure of claim 17, further comprising a metallized redistribution structure comprising a conductive routing feature coupled to one or more of the metallization features of at least one of the IC dies.

* * * * *